(12) United States Patent
Chen et al.

(10) Patent No.: US 8,309,839 B2
(45) Date of Patent: Nov. 13, 2012

(54) METHOD OF IMPROVING THERMOELECTRIC FIGURE OF MERIT OF HIGH EFFICIENCY THERMOELECTRIC MATERIALS

(75) Inventors: Lidong Chen, Shanghai (CN); Xun Shi, Shanghai (CN); Jihui Yang, Tecumseh (CA); Gregory P. Meisner, Ann Arbor, MI (US)

(73) Assignees: GM Global Technology Operations LLC, Detroit, MI (US); Shanghai Institute of Ceramics, Chinese Academy of Sciences, Shanghai, P.R. (CH)

( * ) Notice: Subject to any disclaimer, the term of this patent is extended or adjusted under 35 U.S.C. 154(b) by 3008 days.

(21) Appl. No.: 10/836,643

(22) Filed: Apr. 30, 2004

(65) Prior Publication Data

US 2005/0241689 A1 Nov. 3, 2005

(51) Int. Cl.
*H01L 35/22* (2006.01)
*H01L 35/34* (2006.01)
(52) U.S. Cl. ............... 136/240; 136/201; 136/236.1; 252/521.2; 252/513; 252/519.14; 252/519.4; 419/31; 419/38; 419/39; 419/44; 419/45; 419/53; 419/55; 419/56; 419/57
(58) Field of Classification Search ............... 73/25.05; 216/56; 257/930; 423/344; 136/201, 240, 136/236.1; 252/521.2, 513, 519.14, 519.4; 419/31, 38, 39, 44, 45, 53, 55, 56, 57
See application file for complete search history.

(56) References Cited

U.S. PATENT DOCUMENTS

| | | | | |
|---|---|---|---|---|
| 5,912,429 A | * | 6/1999 | Imanishi et al. | 136/240 |
| 5,929,351 A | * | 7/1999 | Kusakabe et al. | 75/228 |
| 6,261,469 B1 | * | 7/2001 | Zakhidov et al. | 216/56 |
| 6,423,286 B1 | * | 7/2002 | Gryko | 423/344 |
| 2002/0024154 A1 | * | 2/2002 | Hara et al. | 257/930 |
| 2003/0056570 A1 | * | 3/2003 | Shin et al. | 73/25.05 |
| 2004/0187905 A1 | * | 9/2004 | Heremans et al. | 136/238 |

FOREIGN PATENT DOCUMENTS

| | | | | |
|---|---|---|---|---|
| JP | 3089301 | * | 9/2000 | |
| JP | 2001-019544 A | * | 1/2001 | |

OTHER PUBLICATIONS

English Translation of JP3089301.*
Xia et al., "Thermoelectric properties of semimetallic (Zr, Hf)CoSb half-Heusler phases", Journal of Applied Physics, vol. 88, Issue 4, pp. 1952-1955 (2000).*
Ryoji et al., Jan. 23, 2001, Machine Translation of JP 2001-019544 A.*

* cited by examiner

*Primary Examiner* — Jonathan Johnson
*Assistant Examiner* — Golam Mowla
(74) *Attorney, Agent, or Firm* — Reising Ethington P.C.

(57) ABSTRACT

A method of improving the thermoelectric figure of merit (ZT) of a high-efficiency thermoelectric material is disclosed. The method includes the addition of fullerene ($C_{60}$) clusters between the crystal grains of the material. It has been found that the lattice thermal conductivity ($\kappa_L$) of a thermoelectric material decreases with increasing fullerene concentration, due to enhanced phonon-large defect scattering. The resulting power factor ($S^2/\rho$) decrease of the material is offset by the lattice thermal conductivity reduction, leading to enhanced ZT values at temperatures of between 350 degrees K and 700 degrees K.

8 Claims, 4 Drawing Sheets

METHOD OF IMPROVING THERMOELECTRIC FIGURE OF MERIT OF HIGH EFFICIENCY THERMOELECTRIC MATERIALS

FIELD OF THE INVENTION

The present invention relates to high-efficiency thermoelectric materials used in the fabrication of thermoelectric devices. More particularly, the present invention relates to a method of improving the thermoelectric figure of merit of high-performance thermoelectric materials by increasing the fullerene ($C_{60}$) content of the materials.

BACKGROUND OF THE INVENTION

Advanced thermoelectric applications for high efficiency thermoelectric materials include solid state thermoelectric devices for converting thermal energy into electrical energy and for cooling using electricity. Thermoelectric technology is of interest in the automotive industry due to the potential for waste heat recovery to improve fuel economy and for environmentally-friendly cooling. Because the performance of a thermoelectric device depends pivotally on its material properties, much effort has been expended to develop improved thermoelectric materials.

The thermoelectric efficiency of a material is expressed by the dimensionless figure of merit, $ZT=S^2T/\rho\kappa$, where T is the absolute temperature; S is the Seebeck coefficient (thermopower); $\rho$ is the electrical resistivity; and $\kappa$ is the thermal conductivity. The Seebeck coefficient (S) is a measure of how readily the respective charge carriers (electrons or holes) can transfer energy as they migrate through a thermoelectric material which is subjected to a temperature gradient. The type of charge carriers, whether electron or hole, depends on the dopants (N-type or P-type) in the semiconductor materials used to form the thermoelectric material.

The thermoelectric figure of merit (ZT) is related to the strength of interactions between the charge carriers and the vibrational modes of the crystal lattice structure (phonons), as well as the available energy states of the charge carriers. Both the crystal lattice structure and the energy states of the charge carriers depend on the materials selected to form the thermoelectric device. As a result, the thermal conductivity ($\kappa$) is a function of both an electronic component ($\kappa_e$), which is primarily associated with the respective charge carriers, and a lattice component ($\kappa_L$), which is primarily associated with the propagation of phonons through the crystal lattice structure.

In an effort to increase ZT, many material exploration and optimization investigations have been undertaken to lower the lattice thermal conductivity ($\kappa_L$) without deteriorating the power factor ($S^2/\rho$). For example, in thermoelectric materials such as skutterudites, clathrates and chalcogenides, all of which have a microscopic cage-like matrix structure, guest ions interstitially inserted into the voids of the crystal lattice of the materials exhibit large atomic displacement parameters. These guest ions, termed "rattlers", interact with low-frequency lattice phonons. This interaction significantly reduces $\kappa_L$, leading to substantial ZT increases at both low and high temperatures. Other methods of enhancing ZT have included the introduction of simultaneous isoelectronic alloying and doping on different crystallographic sites (in the case of half-Heusler structures), as well as the introduction of point defects in the lattice structure to increase phonon scattering.

SUMMARY OF THE INVENTION

The present invention is generally directed to a method of improving the thermoelectric figure of merit (ZT) of a high-efficiency thermoelectric material. The method includes the addition of fullerene ($C_{60}$) clusters between the crystal grains of the material. It has been found that the lattice thermal conductivity ($\kappa_L$) of a thermoelectric material decreases with increasing fullerene concentration, due to enhanced phonon-large defect scattering. The resulting power factor ($S^2/\rho$) decrease of the material is offset by the lattice thermal conductivity reduction, leading to enhanced ZT values at temperatures of between 350 degrees K and 700 degrees K.

BRIEF DESCRIPTION OF THE DRAWINGS

The invention will now be described, by way of example, with reference to the accompanying drawings, in which.

DETAILED DESCRIPTION OF THE INVENTION

The present invention is generally directed to a method of improving the thermoelectric figure of merit (ZT) of a high-efficiency thermoelectric material. According to the method, fullerene ($C_{60}$), which is a clustered 60-atom carbon molecule, is provided between the crystal grains of the material. It has been found that the lattice thermal conductivity ($\kappa_L$) of a thermoelectric material decreases with increasing fullerene content. Furthermore, it has been found that the dominant scattering mechanism during electrical transport changes from impurity scattering (in the binary material) to grain boundary scattering (in the modified material) at a fullerene concentration of about 5~6 mass percent. The resulting decrease of the power factor ($S^2/\rho$) of the material is offset by the thermal conductivity reduction, leading to enhanced ZT values at temperatures of between 350 degrees K and 700 degrees K.

According to the method of the invention, fullerene is added to the binary (unfilled) thermoelectric material. Referring to the flow diagram of FIG. 1, fabrication of the fullerene-containing thermoelectric material begins with obtaining the fullerene and the metal components for the thermoelectric material, as indicated in step 1. High-purity fullerene ($C_{60}$) and metal powders are typically used for fabrication of the fullerene-containing thermoelectric material.

As indicated in step 2, the fullerene and metal powders are weighed out to obtain the proper molar ratios for these components in the thermoelectric material. Preferably, the powders are weighed out to obtain a nominal fullerene content in the range of between typically about 0 and about 8 mass percent in the thermoelectric material. The fullerene and powdered metal thermoelectric material components are then thoroughly mixed with each other, as indicated in step 3.

Figure 1:
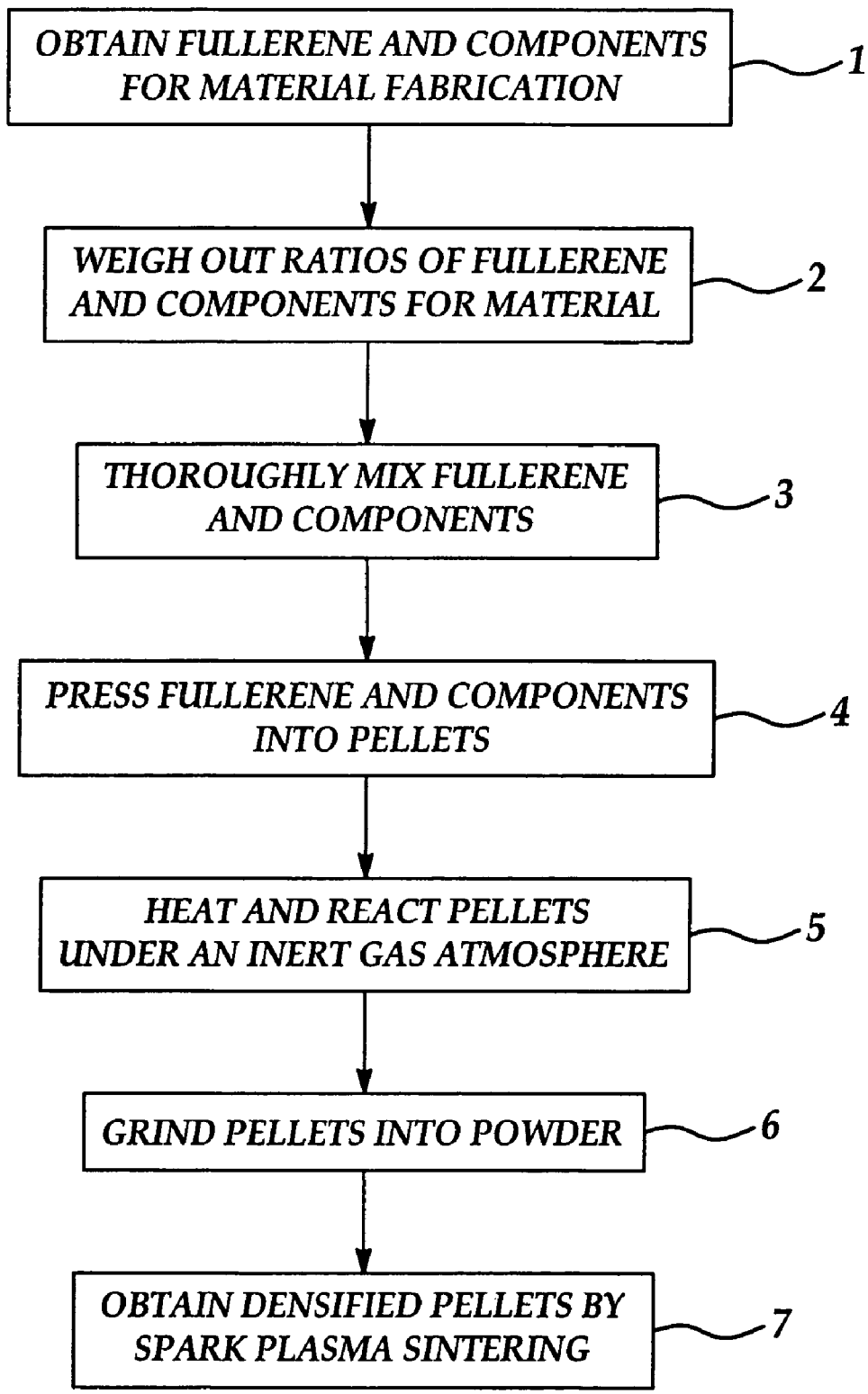
FIG. 1 is a flow diagram which summarizes sequential process steps carried out according to the method of the present invention.

As indicated in step 4 of FIG. 1, the thoroughly-mixed, powdered fullerene and metal thermoelectric material components are next pressed into pellets. As indicated in step 5, the pellets are then heated and reacted at a high reaction temperature in an inert gas atmosphere. Typically, the heating and reacting step includes subjecting the pellets to a temperature of about 943 degrees K in an argon atmosphere for a process time of about 150 hours.

As indicated in step 6 of FIG. 1, the pellets are then ground into powder. This is followed by Spark Plasma Sintering (SPS) (step 7) to yield fully-densified pellets. Typically, the sintering step includes subjecting the pellets to a temperature of about 848 degrees K for about 15 minutes.

In a typical embodiment, fullerene is added to binary (unfilled) skutterudite $CoSb_3$. High-purity Sb (99.9999% pure), Co (99.99% pure) and fullerene ($C_{60}$) (99.5% pure) powders are used for the fullerene-containing skutterudite. The powders are weighed out to obtain a Co:Sb molar ratio of 1:3 and a nominal $C_{60}$ content in the range of between typically about 0 and 8 mass percent. The Co, Sb and $C_{60}$ powders are thoroughly mixed, pressed into pellets, heated and reacted at typically about 943 degrees K under a typically argon atmosphere for typically about 150 hours. The pellets are then ground into fine powders, followed by Spark Plasma Sintering (SPS) at 848 degrees K for 15 minutes to yield fully-densified pellets.

X-ray powder diffraction, wet etching chemical analysis, and electron probe microanalysis (EPMA) were performed to verify the skutterudite crystalline phase, its chemical composition, and the actual $C_{60}$ content and distribution. Electrical resistivity, thermopower and thermal conductivity from 300 degrees K to 800 degrees K were measured. Hall effect was measured in a cryostat equipped with a 5 T magnet between 10 degrees K and 350 degrees K.

X-ray powder diffraction and electron microprobe analysis have shown that the skutterudite phase in all samples is stoichiometric and that there are no secondary phases. The nominal and actual $C_{60}$ mass percent, as well as the skutterudite phase chemical composition, as shown in Table (I) below.

TABLE I

| Nominal $C_{60}$ mass % | Actual $C_{60}$ mass % | Chemical composition of the skutterudite phase | Room temperature hole concentration ($10^{18}$ cm$^{-3}$) |
|---|---|---|---|
| 0 | 0 | $CoSb_{2.995}$ | 1.30 |
| 2 | 0.52 | $CoSb_{3.008}$ | 5.03 |
| 4 | 3.28 | $CoSb_{3.004}$ | 4.67 |
| 5 | 3.90 | $CoSb_{3.004}$ | 5.76 |
| 6 | 4.77 | $CoSb_{3.003}$ | 3.75 |
| 8 | 6.54 | $CoSb_{2.998}$ | 1.38 |

Backscattered electron (BSE) image and carbon x-ray map studies by EMPA for $CoSb_3$ with 6.54 mass % $C_{60}$ have indicated that most of the $C_{60}$ molecules agglomerate into irregular micrometer-sized clusters located at the crystal grain boundaries of $CoSb_3$. The size of the $C_{60}$ clusters varies from a few to 50 μm, and the average size of the $C_{60}$ clusters increases with increasing $C_{60}$ mass %. The average grain size for the $C_{60}$-containing $CoSb_3$ samples of FIGS. 2-7 was about 3 μm.

Figure 2:
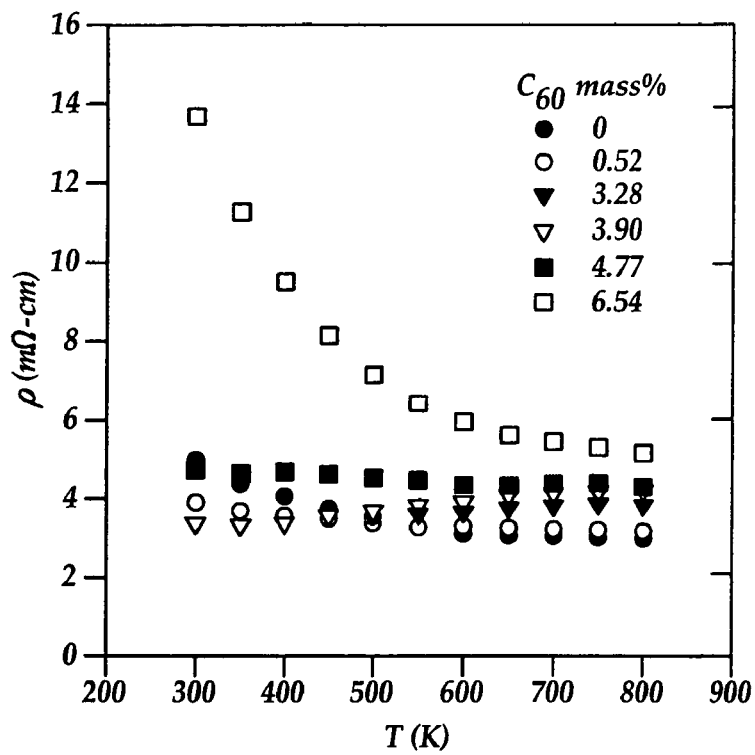
FIG. 2 is a graph which illustrates the temperature dependence, between the temperatures of 300 degrees K and 800 degrees K, of the electrical resistivity of a $C_{60}$-containing thermoelectric material according to the method of the present invention.

The graph of FIG. 2 illustrates the temperature-dependence of electrical resistivity (ρ) for all pellet samples between 300 degrees K and 800 degrees K. The graph illustrates a weak temperature dependence for all $C_{60}$-containing samples except for the highest $C_{60}$ content of 6.54 mass %. The room temperature hole concentrations, which were determined using Hall measurements, are listed in Table I; all samples were p-type. At room temperature, samples with ≦4.77 mass % $C_{60}$ have approximately the same values for ρ, the variation of which is consistent with the observed variation in hole concentration. For a 6.54 mass % $C_{60}$, ρ is about 3 times higher than that for the other samples, although its hole concentration at room temperature is almost the same as that of pure $CoSb_3$. This suggests that the carrier-scattering mechanism is significantly different for this relatively high $C_{60}$ content, as compared to the other samples.

Figure 3:
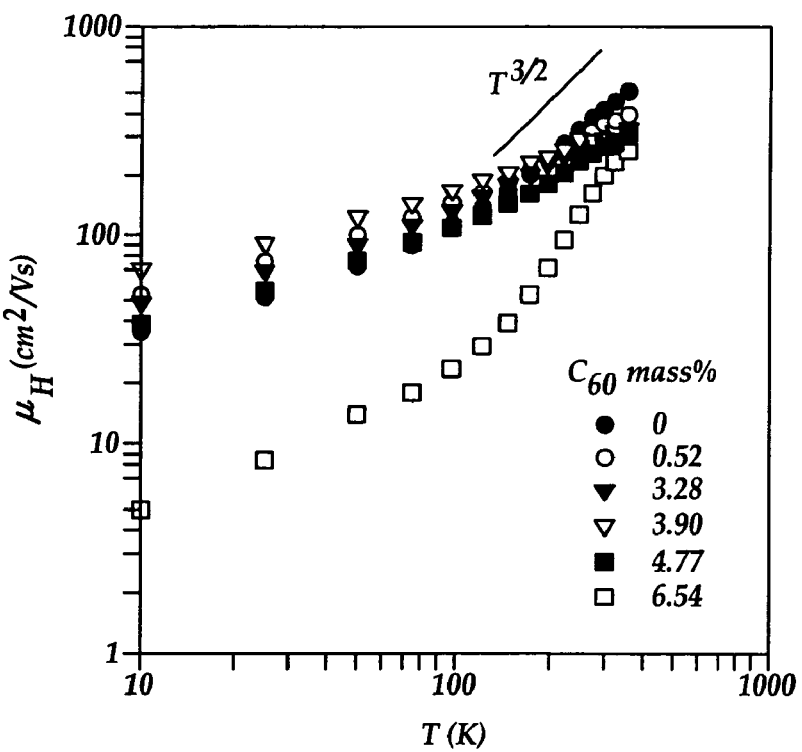
FIG. 3 is a graph which illustrates the temperature dependence, between the temperatures of 10 degrees K and 350 degrees K, of hole mobility in a $C_{60}$-containing thermoelectric material according to the method of the present invention.

The graph of FIG. 3 illustrates the temperature dependence of hole mobility between 10 degrees K and 350 degrees K, where hole mobility is estimated by the equation $\mu_H = 1/pe\rho$, where p is the hole concentration and e is the electron charge. At room temperature, $\mu_H = 423$ cm$^2$/V·s and $\mu_H$ directly proportional to $T^{3/2}$ (as illustrated by the solid line) are observed for pure $CoSb_3$, indicating that electrical transport is dominated by strong ionized impurity scattering for the charge carriers. This is consistent with data reported for polycrystalline $CoSb_3$ with small grain sizes.

As the $C_{60}$ content increases, the room temperature $\mu_H$ value decreases. For samples with ≦4.77 mass % $C_{60}$, the $\mu_H$ directly proportional to $T^{3/2}$ relation persists near room temperature. The data shown in FIG. 3, however, suggests that a different carrier-scattering mechanism dominates electrical transport for 6.54 mass % $C_{60}$, as evidenced by the much larger slope shown in FIG. 3. The backscattered electron (BSE) image studies indicated above have shown that $C_{60}$ agglomerates into clusters between the crystal grains of $CoSb_3$, and the average size of the $C_{60}$ clusters increases as the quantity of $C_{60}$ increases.

Figure 4:
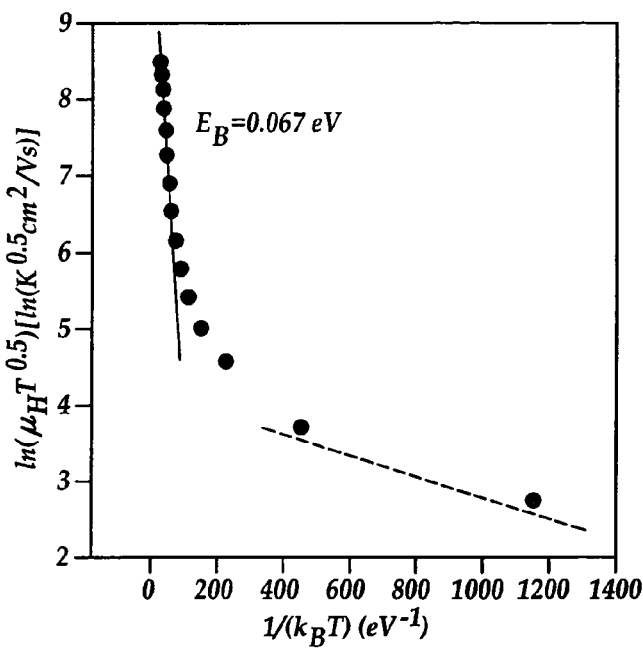
FIG. 4 is an Arrhenius plot of $\ln(\lambda_H T^{0.5})$ versus $1/(k_B T)$ for 6.54 mass % $C_{60}$ between the temperatures 10 degrees K and 350 degrees K.

In the case of carriers primarily scattered by grain barriers, the carrier mobility can be written as $\mu_H = el/(\sqrt{8 k_B T \pi m^*})$ $(e^{-E_B/k_B T})$, where l is the average grain size, $k_B$ is the Boltzmann constant, m* is the carrier effective mass, and $E_B$ is the activation energy which characterizes the barrier height. FIG. 4 is an Arrhenius plot of $\ln(\mu_H T^{1/2})$ versus $1/(k_B T)$ for 6.54 mass % $C_{60}$ between 10 degrees K and 350 degrees K. Two linear regions can be seen in FIG. 4, with the knee of the curve occurring at about 175 degrees K. Similar carrier mobility behaviors have been observed in many materials with strong grain-carrier scatterings. Carrier transport is believed to be dominated by thermionic emission over grain boundary barriers at high temperatures and by thermally-assisted tunneling at low temperatures. From the high-temperature slope in FIG. 4 can be calculated $E_B = 0.067$ eV, which is within the range of between 0 and 0.2 eV for most of the materials surveyed. Thus, it is believed that hole grain barrier scattering is the dominant carrier-scattering mechanism for $CoSb_3$ containing 6.54 mass % $C_{60}$. The data implies that a transition from ionized impurity scattering-dominated electrical transport to grain barrier scattering-dominated electrical transport occurs when the $C_{60}$ concentration rises above ~5 to 6 mass %. The much-reduced mobility for $CoSb_3$ with 6.54 mass % $C_{60}$, as compared to the mobility of those with lower $C_{60}$ concentrations (FIG. 3), is consistent with its much-increased ρ (FIG. 2).

Figure 5A:
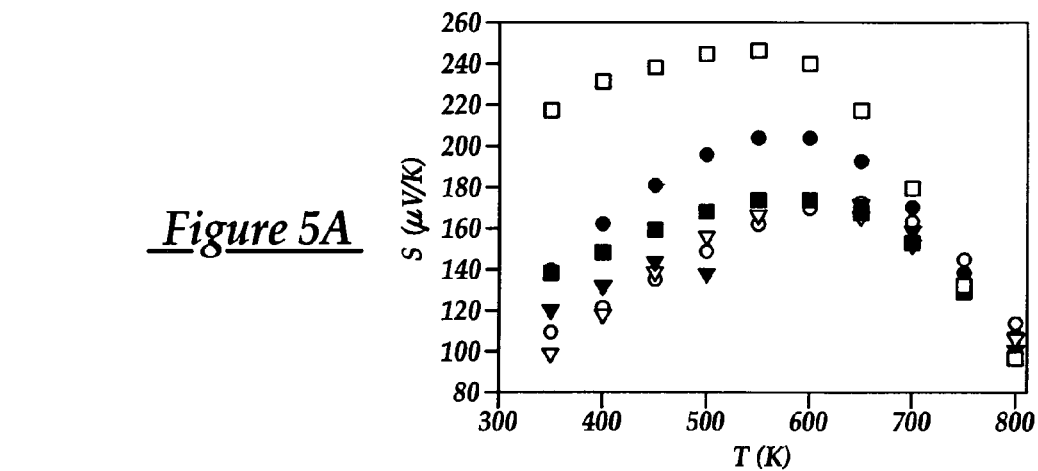
FIGS. 5A and 5B are graphs which illustrates S and $S^2/\rho$ as a function of the temperatures between 350 degrees K and 800 degrees K, of a $C_{60}$-containing thermoelectric material according to the method of the present invention.
Figure 5B:
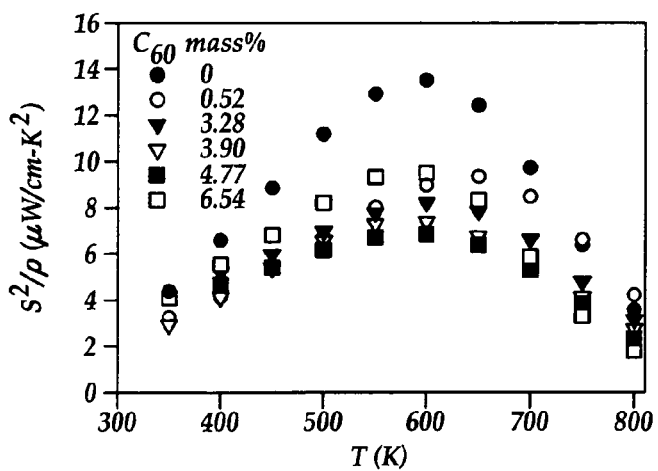

The graph of FIG. 5 illustrates S (Seebeck coefficient or thermopower) and $S^2/\rho$ (power factor) as a function of temperature between 350 degrees K and 800 degrees K. As the temperature increases, S initially increases, reaches a maximum, and then decreases. Samples with $\leq 4.77$ mass % of $C_{60}$ have comparable S values at 350 degrees K between 100 µV/K and 140 µV/K, reflecting the observed variations in hole concentration. The S value at 350 degrees K for pure $CoSb_3$ matches that reported previously for samples with similar hole concentrations. Thermopower depends not only on carrier concentration but also on the carrier scattering mechanism. The sample with 6.54 mass % $C_{60}$ shows a much higher S value (~120 µV/K) at 350 degrees K than those of the others. This much-enhanced S value is attributed to the transition to grain boundary barrier-dominated scattering because its hole concentration is almost identical to that of pure $CoSb_3$, as shown in Table I.

Figure 6:
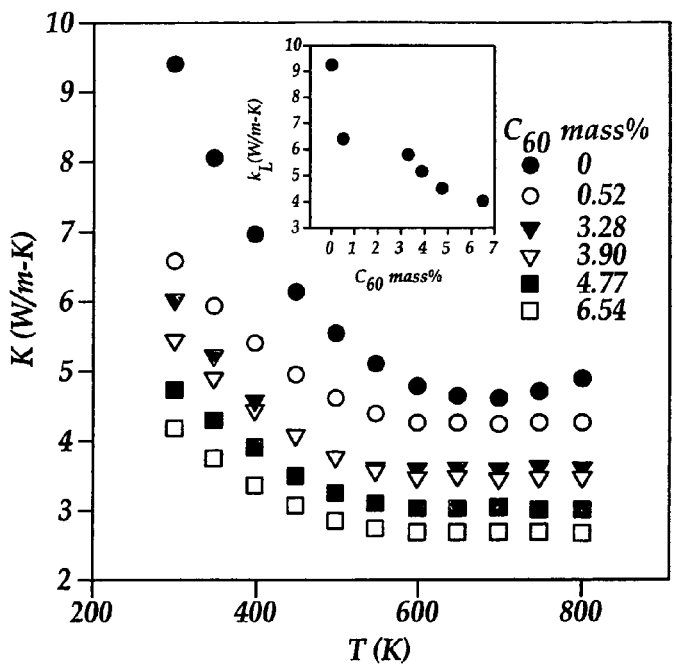
FIG. 6 is a graph which illustrates the total thermal conductivity ($\kappa$) data, between the temperatures of 300 degrees K and 800 degrees K, of a $C_{60}$-containing thermoelectric material according to the method of the present invention.

The total thermal conductivity ($\kappa$) data between 300 degrees K and 800 degrees K are plotted in the graph of FIG. 6. The inset shows the dependence of room temperature ($\kappa_L$) on the $C_{60}$ concentration, where $\kappa_L$ is estimated by subtracting the electronic thermal conductivity ($\kappa_e$) using the Wiedemann-Frantz law. At room temperature, $\kappa_e$ is less than 5% of $\kappa$ for all samples, and $\kappa_L$=9.38 W/m-K at room temperature for the pure $CoSb_3$, consistent with literature values[1]. It has been found that as the $C_{60}$ concentration in $CoSb_3$ increases, $\kappa_L$ decreases monotonically at all temperatures.

The room temperature value of $\kappa_L$ for $CoSb_3$ containing 6.54 mass % of $C_{60}$ is 4.06 W/m-K, which is more than a factor of two smaller than that of pure $CoSb_3$. At room temperature, the phonon wavelength $\lambda_p$ can be estimated using the dominant phonon approximation $h(2\pi v/\lambda_p)=1.6\ k_B T$, where h and v are the reduced Planck constant and sound velocity, respectively. By using v=2700 m/s for $CoSb_3$,[1] $\lambda_p$=2.6 Å at room temperature. This value of $\lambda_p$ is much smaller than the cluster sizes of $C_{60}$; therefore, it is concluded that the reduction of $\kappa_L$ in the presence of $C_{60}$ is due to additional phonon scattering by large defects. Unlike phonon scattering by point defects, carriers and phonons, all of which are frequency-dependent, phonon scattering by large defects is independent of phonon frequency but depends on the concentration and the geometric size of the defects. According to a model by Vandersande, both higher defect concentration and larger average defect size result in lower $\kappa_L$, and the obtained $\kappa_L$ data are consistent with this prediction.

Figure 7A:
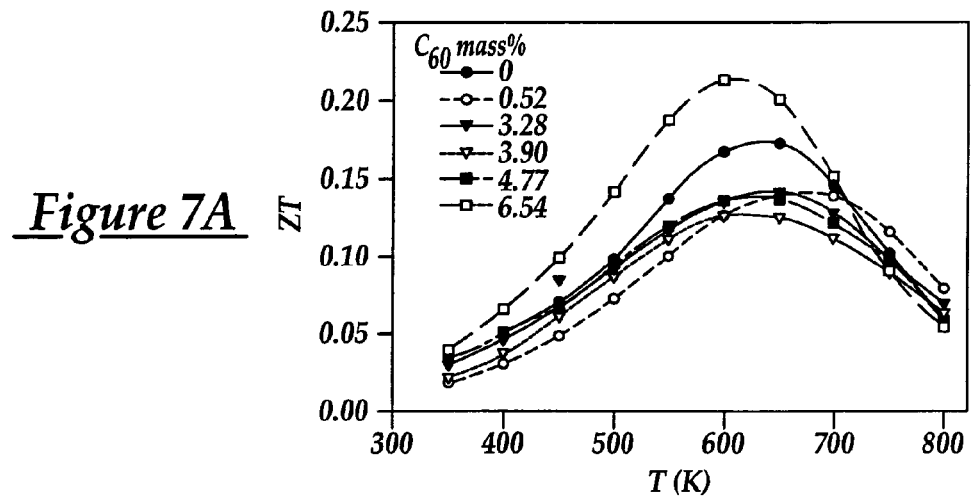
FIGS. 7A and 7B are graphs which illustrates the thermoelectric figure of merit (ZT) for a $C_{60}$-containing thermoelectric material according to the method of the present invention.
Figure 7B:
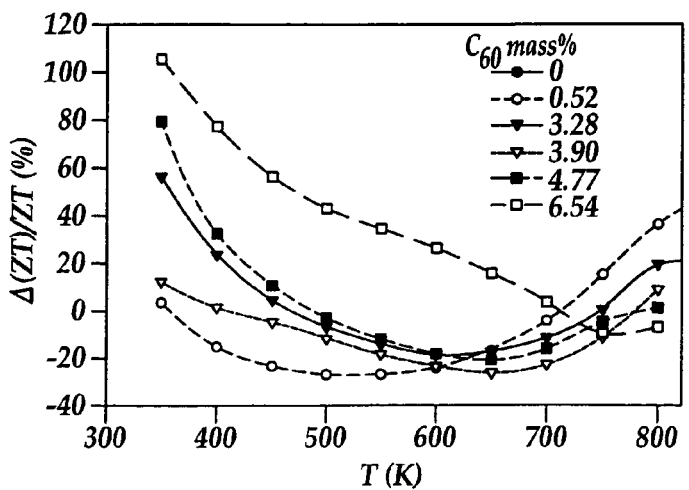

FIG. 7 shows the thermoelectric figure of merit (ZT) for $C_{60}$-containing $CoSb_3$ between 350 degrees K and 800 degrees K. The difference between the thermoelectric figure of merit for pure $CoSb_3$ ($ZT_{pure}$) and $CoSb_3$ containing $C_{60}$ ($ZT_{C60}$) is characterized by $\Delta(ZT)/ZT=(ZT_{C60}-ZT_{pure})/ZT_{pure}$, and this is also plotted in FIG. 7. A significant increase in ZT for $CoSb_3$ containing 6.54 mass % $C_{60}$ was observed throughout almost the entire temperature range. The value of $\Delta(ZT)/ZT$ is about 105% at 350 degrees K, decreases with increasing temperature, attains about 44% at 500 degrees K, and reaches about 10% between 750 degrees K and 800 degrees K. For the other $C_{60}$-containing samples, $\Delta(ZT)/ZT$ values are usually positive at low and high temperatures and become negative at intermediate temperatures. The enhancement of ZT, especially at 6.54 mass % $C_{60}$, is primarily due to $\kappa_L$ reduction as a result of phonon-large defect scattering in the presence of $C_{60}$ clusters between the crystal grains of $CoSb_3$.

It has been found that $C_{60}$ agglomerates into micro-sized clusters located between $CoSb_3$ crystal grains and that $C_{60}$ cluster size increases with increasing $C_{60}$ concentration. It has also been found that $\kappa_L$ decreases with increasing $C_{60}$ concentration, due to enhanced phonon-large defect scattering. At about 5 to 6 mass % $C_{60}$ concentration, a transition from ionized impurity scattering to grain boundary scattering domination in electrical transport is observed. The power factor decrease is offset by the significant thermal conductivity reduction for 6.54 mass % $C_{60}$ in $CoSb_3$, leading to enhanced ZT values at temperatures of between 350 degrees K and 700 degrees K. The data suggest that even larger ZT values would be attainable for the prospective high-performance thermoelectric materials such as filled skutterudites, clathrates and half-Heuslers, by the method of $C_{60}$ addition according to the method of the present invention.

While the preferred embodiments of the invention have been described above, it will be recognized and understood that various modifications can be made in the invention and the appended claims are intended to cover all such modifications which may fall within the spirit and scope of the invention.

The invention claimed is:

1. A method of increasing a thermoelectric figure of merit of a thermoelectric material, comprising:
    providing at least a first metal element containing precursor material and a second metal element containing precursor material, each precursor material being in powder form and together comprising elements of a thermoelectric material;
    mixing the precursor materials with fullerene to form a mixture;
    reacting the mixture under an inert gas atmosphere to form the thermoelectric material in crystalline form; and
    sintering the reacted mixture to form fullerene clusters dispersed between crystal grains of the thermoelectric material.

2. The method of claim 1 wherein said thermoelectric material comprises a skutterudite.

3. The method of claim 1 wherein said fullerene is present in said thermoelectric material in a quantity of at least about 0.5 mass percent.

4. The method of claim 3 wherein said thermoelectric material comprises $CoSb_3$.

5. The method of claim 1 wherein said thermoelectric material is a clathrate or a half-Heusler.

6. The method of claim 1 wherein the first metal element containing precursor material comprises cobalt and the second metal element containing precursor material comprises antimony, and wherein the cobalt and antimony are present in a cobalt:antimony molar ratio of about 1:3.

7. The method of claim 1 wherein sintering comprises spark plasma sintering.

8. The method of claim 7 wherein said fullerene is present in said thermoelectric material in a quantity of at least about 0.5 mass percent.

* * * * *